US011980058B2

(12) United States Patent
Wang et al.

(10) Patent No.: US 11,980,058 B2
(45) Date of Patent: May 7, 2024

(54) DISPLAY SUBSTRATE INCLUDING ADDITIONAL INSULATING LAYER BETWEEN TRANSISTOR GATE AND ACTIVE LAYER FOR PREVENTING DARK SPOTS, PREPARATION METHOD THEREOF, AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Haitao Wang, Beijing (CN); Qinghe Wang, Beijing (CN); Jun Wang, Beijing (CN); Tongshang Su, Beijing (CN); Jun Cheng, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 332 days.

(21) Appl. No.: 17/486,790

(22) Filed: Sep. 27, 2021

(65) Prior Publication Data
US 2022/0157907 A1 May 19, 2022

(30) Foreign Application Priority Data
Nov. 13, 2020 (CN) .......................... 202011269351.4

(51) Int. Cl.
*H10K 59/121* (2023.01)
*H10K 59/12* (2023.01)
(Continued)

(52) U.S. Cl.
CPC ..... *H10K 59/1213* (2023.02); *H10K 59/1216* (2023.02); *H10K 59/126* (2023.02);
(Continued)

(58) Field of Classification Search
CPC .......... H10K 59/1201; H10K 59/1213; H10K 59/1216; H10K 59/124; H10K 59/126;
(Continued)

(56) References Cited

U.S. PATENT DOCUMENTS 9,437,618 B2 * 9/2016 Chou .................. H01L 27/1255
2004/0126945 A1 * 7/2004 Shibata ................. H10K 59/12
438/210

(Continued)

Primary Examiner — Matthew E. Gordon
(74) Attorney, Agent, or Firm — IPro, PLLC

(57) ABSTRACT

A display substrate, a preparation method thereof, and a display apparatus are provide. The display substrate includes: a base substrate, an active layer disposed on the base substrate, a first gate insulating layer disposed on the active layer, a first conductive layer disposed on the first gate insulating layer, and a second conductive layer disposed on the first conductive layer and electrically connected with the first conductive layer; an orthographic projection of the first conductive layer on the base substrate does not overlap with an orthographic projection of the active layer on the base substrate; the second conductive layer includes gates; orthographic projections of the gates on the base substrate and the orthographic projection of the active layer on the base substrate have an overlap area; and the display substrate further includes: at least one insulating layer located between the first conductive layer and the gates.

15 Claims, 5 Drawing Sheets

(51) Int. Cl.
*H10K 59/126* (2023.01)
*H10K 59/131* (2023.01)
*H10K 71/00* (2023.01)

(52) U.S. Cl.
CPC ........... *H10K 59/131* (2023.02); *H10K 71/00* (2023.02); *H10K 59/1201* (2023.02)

(58) Field of Classification Search
CPC ...... H10K 59/131; H10K 71/00; H10K 71/40; H10K 71/421; H10K 71/441
USPC ......................................................... 257/40
See application file for complete search history.

(56) References Cited

U.S. PATENT DOCUMENTS

2014/0353605 A1* 12/2014 Kim ..................... H01L 27/124
257/66
2022/0149137 A1* 5/2022 Wang ................. H10K 59/1213

\* cited by examiner

DISPLAY SUBSTRATE INCLUDING ADDITIONAL INSULATING LAYER BETWEEN TRANSISTOR GATE AND ACTIVE LAYER FOR PREVENTING DARK SPOTS, PREPARATION METHOD THEREOF, AND DISPLAY APPARATUS

CROSS REFERENCE TO RELATED APPLICATIONS

The application claims priority to Chinese Patent Application No. 202011269351.4, filed to the China National Intellectual Property Administration on Nov. 13, 2020, the entire contents of which are incorporated herein by reference.

FIELD

The present disclosure relates to the field of display, in particular to a display substrate, a preparation method thereof, and a display apparatus.

BACKGROUND

At present, organic light-emitting diode (OLED) display products have the advantages of large screen brightness, wide color gamut, low power consumption, large viewing angles and the like, thereby being vigorously developed. An OLED display panel includes a thin film transistor (TFT), while a TFT in a pixel circuit usually uses an oxide semiconductor material as an active layer, and the oxide semiconductor material may be, for example, an indium gallium zinc oxide (IGZO).

An OLED display panel of the related art includes a base substrate, a buffer layer located on the base substrate, an active layer located on the buffer layer, a gate insulating layer located on the active layer, and a gate layer located on the gate insulating layer. A buffer layer deposition process is prone to producing foreign matters such as particles, and if the foreign matters fall on a region where the gate layer and the active layer overlap, due to the fact that the overlap region of the gate layer and the active layer only includes the gate insulating layer which is very thin, the foreign materials are prone to piercing the gate insulating layer, causing the gate layer and the active layer to conduct. A gate insulating layer deposition process is also prone to producing foreign materials such as particles, which causes the gate insulating layer to fall off, and the gate layer and the active layer to conduct.

In summary, the display panel of the related art is prone to causing conduction between the gate layer and the active layer, the display of bright point and dark point is poor, and the display effect is affected.

SUMMARY

Embodiments of the present disclosure provide a display substrate, a preparation method thereof, and a display apparatus.

In a first aspect, the embodiments of the present disclosure provide a display substrate, wherein the display substrate includes: a base substrate, an active layer located on the base substrate, a first gate insulating layer disposed on the active layer, a first conductive layer disposed on the first gate insulating layer, and a second conductive layer disposed on the first conductive layer and electrically connected with the first conductive layer;

an orthographic projection, on the base substrate, of the first conductive layer does not overlap with an orthographic projection, on the base substrate, of the active layer;

the second conductive layer includes gates; orthographic projections, on the base substrate, of the gates and the orthographic projection, on the base substrate, of the active layer have an overlap area; and the display substrate further includes: at least one insulating layer disposed between the first conductive layer and the gates.

In some embodiments, the at least one insulating layer includes a first insulating layer;

the first conductive layer includes a first connection lead part and a second connection lead part respectively disposed on two sides of the active layer;

the first insulating layer is provided with a first via hole exposing the first connection lead part and a second via hole exposing the second connection lead part; and at least one of the gate is electrically connected with the first connection lead part through the first via hole, and is electrically connected with the second connection lead part through the second via hole.

In some embodiments, the display substrate further includes:

a third conductive layer disposed between the first insulating layer and the gates; and the at least one insulating layer further includes:

a second insulating layer disposed between the third conductive layer and the gates.

In some embodiments, the second conductive layer further includes: a sources and a drains.

In some embodiments, the display substrate further includes: a third insulating layer disposed on the second conductive layer, and a source and drain electrode layer disposed on the third insulating layer; and the source and drain electrode layer includes sources and drains.

In some embodiments, the display substrate further includes: a light shielding layer disposed between the base substrate and the active layer.

In some embodiments, the display substrate further includes: a protective layer disposed on the second conductive layer.

In a second aspect, the embodiments of the present disclosure provide a preparation method of a display substrate, wherein the method includes:

forming an active layer on a base substrate;

forming a first gate insulating layer on the active layer;

forming a pattern of a first conductive layer on the first gate insulating layer, wherein an orthographic projection, on the base substrate, of the first conductive layer does not overlap with an orthographic projection of the active layer on the base substrate;

forming at least one insulating layer on the first conductive layer; and forming a second conductive layer electrically connected with the first conductive layer on the insulating layer, wherein the second conductive layer includes gates, and orthographic projections, on the base substrate, of the gate and the orthographic projection, on the base substrate, of the active layer have an overlap area.

In some embodiments, the forming the at least one insulating layer on the first conductive layer, includes:

forming a first insulating layer on the first conductive layer, and forming a via hole penetrating through the first insulating layer and exposing the first conductive layer; and the forming the second conductive layer electrically connected with the first conductive layer on the at least one insulating layer, includes:

depositing a conductive material on the first insulating layer to form the second conductive layer, and forming a pattern of the gate by adopting a patterning process;

at least one of the gates is electrically connected with the first conductive layer through the via hole.

In some embodiments, the forming the pattern of the first conductive layer, includes:

depositing a conductive material on the first gate insulating layer to form the first conductive layer;

coating photoresist on the first conductive layer;

performing patterning treatment on the photoresist by adopting a halftone mask process, removing all the photoresist in a first region, thinning the photoresist in a second region, and reserving the photoresist in a third region; in the second region, the orthographic projection, on the base substrate, of the active layer and the orthographic projection, on the base substrate, of the first conductive layer have an overlap area;

removing part of the first conductive layer in the first region by adopting a wet etching process;

removing the photoresist in the second region, and thinning the photoresist in the third region;

removing part of the first conductive layer in the second region by adopting the wet etching process; and stripping off the photoresist in the third region.

In some embodiments, while adopting the patterning process to form the pattern of the gate, the method further includes:

forming patterns of sources and drains.

In the third aspect, the embodiments of the present disclosure provide a display apparatus, including the display substrate provided according to the first aspect of the embodiments of the present disclosure.

BRIEF DESCRIPTION OF THE DRAWINGS

In order to explain technical solutions of embodiments of the present disclosure clearly, the drawings that need to be used in the embodiments will be briefly introduced below. Apparently, the drawings introduced below are only some embodiments of the present disclosure, and for those ordinary skilled in the art, on the premise of no creative labor, other drawings can also be obtained according to these drawings.

DETAILED DESCRIPTION OF THE EMBODIMENTS

Figure 1:
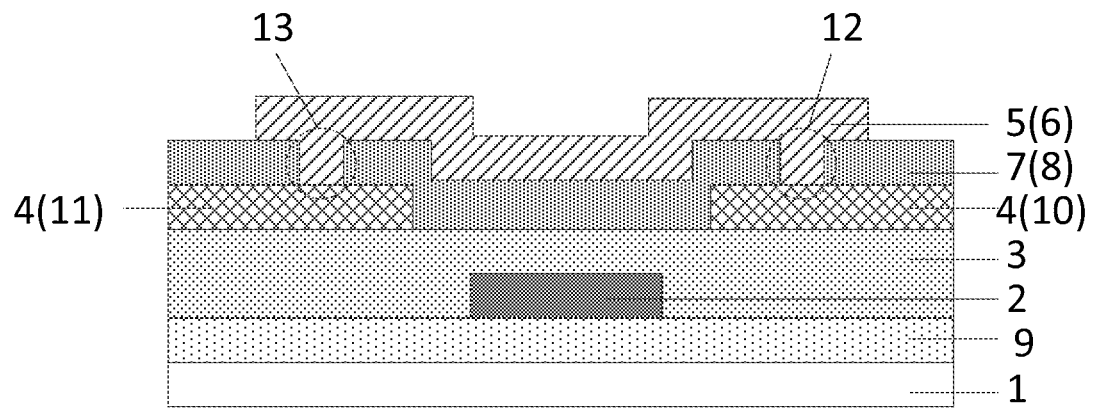
FIG. 1 is a schematic structural diagram of a display substrate provided by an embodiment of the present disclosure.

In order to make objectives, technical solutions, and advantages of embodiments of the present disclosure clearer, the technical solutions of the embodiments of the present disclosure will be described clearly and completely in combination with the accompanying drawings of the embodiments of the present disclosure. Apparently, the described embodiments are merely some, but not all embodiments of the present disclosure. Also, the embodiments and features in the embodiments of the present disclosure may be combined with one another without conflict. Based on the described embodiments of the present disclosure, all other embodiments attainable by those ordinary skilled in the art without any inventive effort are within the protection scope of the present disclosure.

Unless defined otherwise, technical or scientific terms used in the present disclosure shall have common meaning understood by those ordinary skilled in the art to which the present disclosure belongs. "First", "second", and similar words used in the present disclosure do not denote any order, quantity, or importance, but are solely used to distinguish one from another. "Include" or "comprise", and the like mean that elements or items that precede the word cover the elements or items listed after the word and equivalents thereof, but does not exclude other elements or items. Similar words such as "linked" or "connected", and the like are not limited to physical or mechanical connections, but may include electrical connections, whether direct or indirect.

It should be noted that dimensions and shapes of various figures in the drawings do not reflect a true scale and are only intended to illustrate contents of the present disclosure. Same or similar reference numerals refer to same or similar elements or elements having same or similar functions throughout.

The embodiments of the present disclosure provide a display substrate. As shown in FIG. 1, the display substrate includes: a base substrate 1, an active layer 2 disposed on the base substrate 1, a first gate insulating layer 3 disposed on the active layer 2, a first conductive layer 4 disposed on the first gate insulating layer 3, and a second conductive layer 5 disposed on the first conductive layer 4 and electrically connected with the first conductive layer 4;

an orthographic projection of the first conductive layer 4 on the base substrate 1 does not overlap with an orthographic projection of the active layer 2 on the base substrate 1;

the second conductive layer 5 includes gates 6; orthographic projections of the gates 6 on the base substrate 1 and the orthographic projection of the active layer 2 on the base substrate 1 have an overlap area; and the display substrate further includes: at least one insulating layer 7 disposed between the first conductive layer 4 and the gates.

According to the display substrate provided by the embodiments of the present disclosure, the first gate insulating layer is included between the first conductive layer and the active layer, the orthographic projection of the first conductive layer on the base substrate does not overlap with and the orthographic projection of the active layer on the base substrate, and at least one insulating layer is included between the gates of which the orthographic projections overlaps with the orthographic projection of the active layer on the base substrate and the first conductive layer, that is, at least two insulating layers are included between the gates and the active layer. Even if foreign materials such as particles appear in the preparation process of the display substrate and consequently the first gate insulating layer is pierced or the first gate insulating layer is partially peeled off, the insulating layer disposed on the first gate insulating layer may cover the foreign materials such as the particles, so that the active layer and the gates can be prevented from conducting, bright point and dark point can be prevented from showing poorly, and the display effect is improved.

In some embodiments, as shown in FIG. 1, the display substrate further includes a buffer layer 9 disposed between the active layer 2 and the base substrate 1.

In some embodiments, as shown in FIG. 1, the insulating layer 7 includes: a first insulating layer 8 disposed between the first conductive layer 4 and the gates 6.

The first conductive layer 4 includes: a first connection lead part 10 and a second connection lead part 11 respectively disposed on two sides of the active layer 2.

The first insulating layer 8 is provided with a first via hole 12 exposing the first connection lead part 10 and a second via hole 13 exposing the second connection lead part 11.

At least one of the gates 6 is electrically connected with the first connection lead part 10 through the first via hole 12, and is electrically connected with the second connection lead part 11 through the second via hole 13.

According to the display substrate provided by the embodiments of the present disclosure, at least two insulating layers are included between the gates and the active layer. Even if the foreign materials such as the particles appear in the preparation process of the display substrate and consequently the first gate insulating layer is pierced or the first gate insulating layer is partially peeled off, the insulating layer disposed on the first gate insulating layer may cover the foreign materials such as the particles, so that the active layer and the gates can be prevented from conducting, the bright and dark spots can be prevented from showing poorly, and the display effect is improved. In addition, at least part of the gates is electrically connected with the first connection lead part and the second connection lead part of the first conductive layer, so that a signal is provided to the gate through the first connection lead part and the second connection lead part.

In some embodiments, the display substrate includes: a pixel drive circuit; the pixel drive circuit has transistors and a capacitor, and generates an electrical signal through the interaction of the transistors and the capacitor. When the display substrate further includes a light-emitting device, the electrical signal generated by the interaction of the transistors and the capacitor is input into an anode of the light-emitting device and a corresponding voltage is applied to a cathode of the light-emitting device, which may drive the light-emitting device to emit light. In specific implementation, the first conductive layer includes, for example, a scan signal line and a reset signal line. A part electrically connected to the gate may be a first connection lead part and a second connection lead part of the scan signal line, or a first connection lead part and a second connection lead part of the reset signal line. The light-emitting device may be configured as an electroluminescent diode, such as at least one of an OLED or a QLED. The light-emitting device may include the anode, a light-emitting layer, and the cathode that are stacked. Further, the light-emitting layer may also include film layers such as a hole injection layer, a hole transport layer, an electron transport layer, and an electron injection layer.

Figure 2:
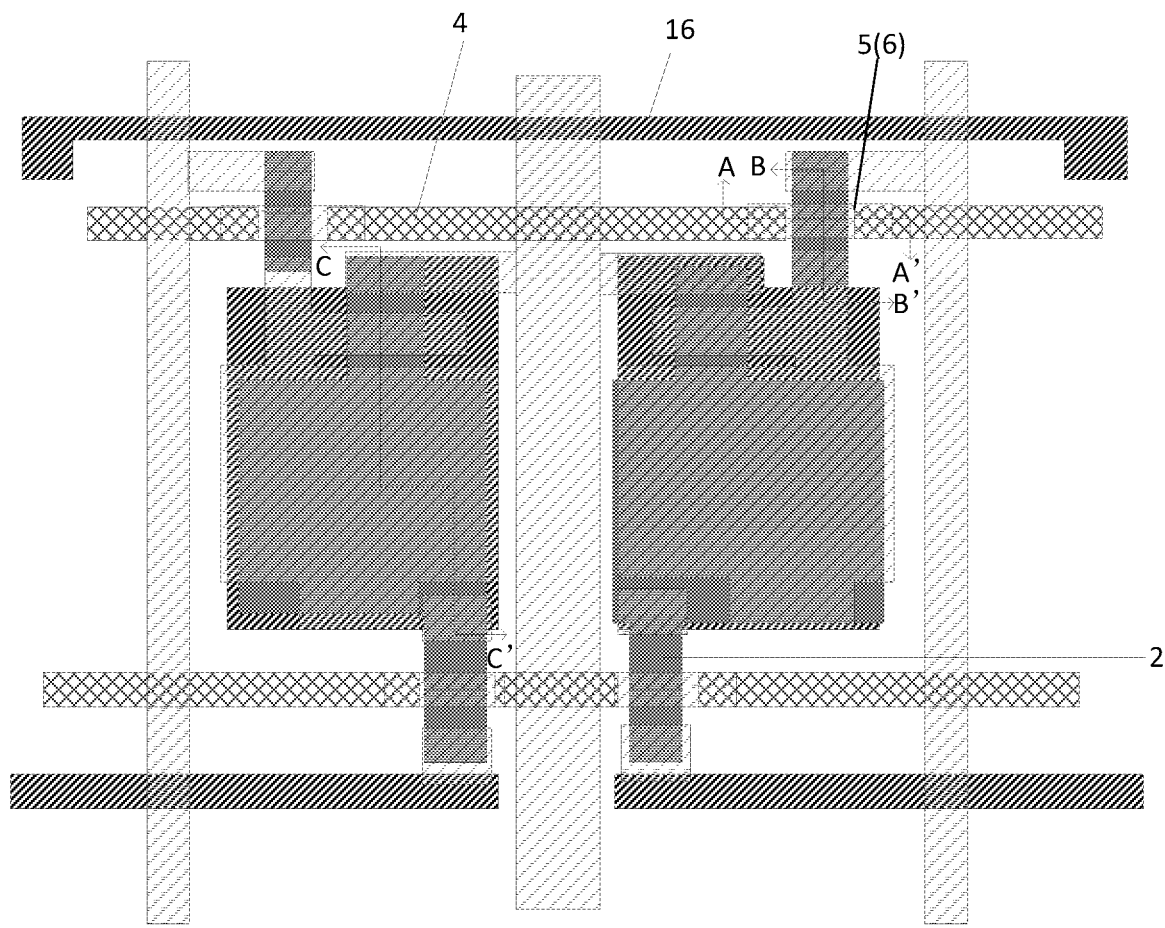
FIG. 2 is a schematic structural diagram of another display substrate provided by an embodiment of the present disclosure.

In some embodiments, a top view of the display substrate may be, for example, as shown in FIG. 2, and the pixel drive circuit includes three transistors and one capacitor. The display substrate may further include: a light shielding layer 16 between the base substrate and the active layer 2. The active layer may include, for example, a channel region, a first conducting region, and a second conducting region of each transistor. The active layer may be made of amorphous silicon, polysilicon, an oxide semiconductor material, and the like. The oxide semiconductor material may be, for example, an Indium Gallium Zinc Oxide, IGZO. It should be noted that the above-mentioned first conducting region and second conducting region may be regions doped with n-type impurities or p-type impurities. The first conductive layer 4 includes, for example, the scan signal line, the reset signal line and the like. In specific implementation, FIG. 1 may be, for example, a cross-sectional view along AA' in FIG. 2.

Figure 3:
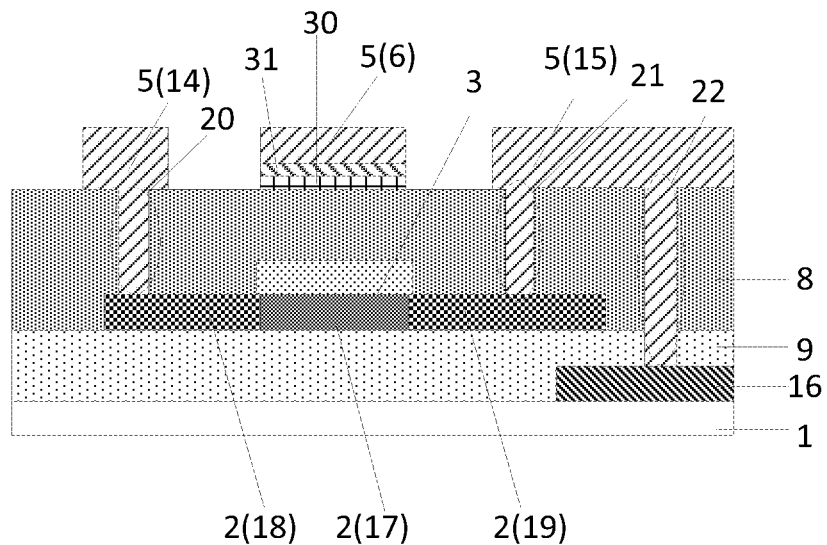
FIG. 3 is a schematic structural diagram of yet another display substrate provided by an embodiment of the present disclosure.

In some embodiments, a cross-sectional view along BB' in FIG. 2 is as shown in FIG. 3, and the second conductive layer 5 further includes: sources 14 and drains 15.

That is to say, in the display substrate provided by the embodiments of the present disclosure, the gates, the sources and the drains are disposed on a same layer, i.e. the second conductive layer, so that the gates, the sources and the drains are simultaneously formed in a patterning process only by changing a pattern of the second conductive layer, there is no need to add an additional gate manufacturing process, and the process is simple and easy to implement.

As shown in FIG. 3, the active layer 2 includes: the channel region 17, the first conducting region 18 and the second conducting region 19. The first insulating layer 8 also is provided with third via holes 20 exposing the first conducting region 18 and fourth via holes 21 exposing the second conducting region 19, each of the sources 14 is electrically connected with the first conducting region 18 through a respective one of the third via holes 20, and each of the drains 15 is electrically connected with the second conducting region 19 through a respective one of the fourth via holes 21. Each of the drains 15 are also electrically connected with the light shielding layer 16 through a respective one of fifth via holes 22 penetrating through the first insulating layer 8 and the buffer layer 9.

Figure 4:
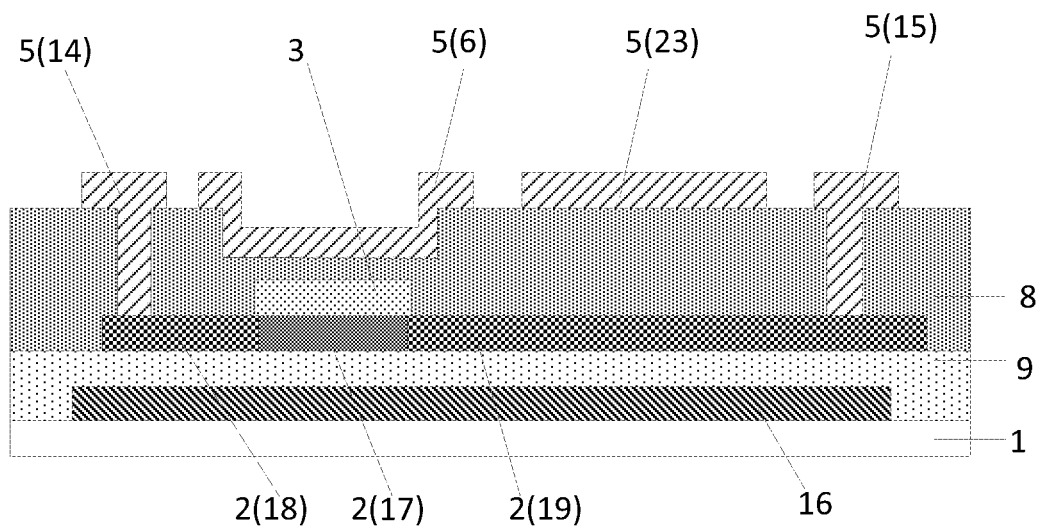
FIG. 4 is a schematic structural diagram of yet another display substrate provided by an embodiment of the present disclosure.

A cross-sectional view along CC' in FIG. 2 is as shown in FIG. 4, and the first conductive layer 5 further includes a first electrode 23. In FIG. 4, the second conducting region 19 includes a second electrode of the capacitor.

In some embodiments, the display substrate further includes: a protective layer disposed on the second conductive layer, a color film layer disposed on the protective layer, and a planarization layer disposed on the color film layer, an anode and a pixel definition layer disposed on the planarization layer, the light-emitting layer disposed on the anode, a cathode disposed on the light-emitting layer, and an encapsulation layer disposed on the cathode.

When the gates, the sources and the drains are disposed on the same layer, in some embodiments, as shown in FIG. 3, the display substrate further includes: a third conductive layer 30 disposed between the first insulating layer 8 and the gates 6, that is, the third conductive layer 30 is disposed between the first insulating layer 8 and the second conductive layer 5, since the gates 6 included by the second conductive layer 5; and the insulating layer further includes: a second insulating layer 31 disposed between the third conductive layer 30 and the gates 6.

In specific implementation, when the display substrate further includes the third conductive layer, the third conductive layer includes, for example, the first electrode of the capacitor, that is, a conductive layer including the electrode of the capacitor may be additionally disposed according to actual needs.

Figure 7:
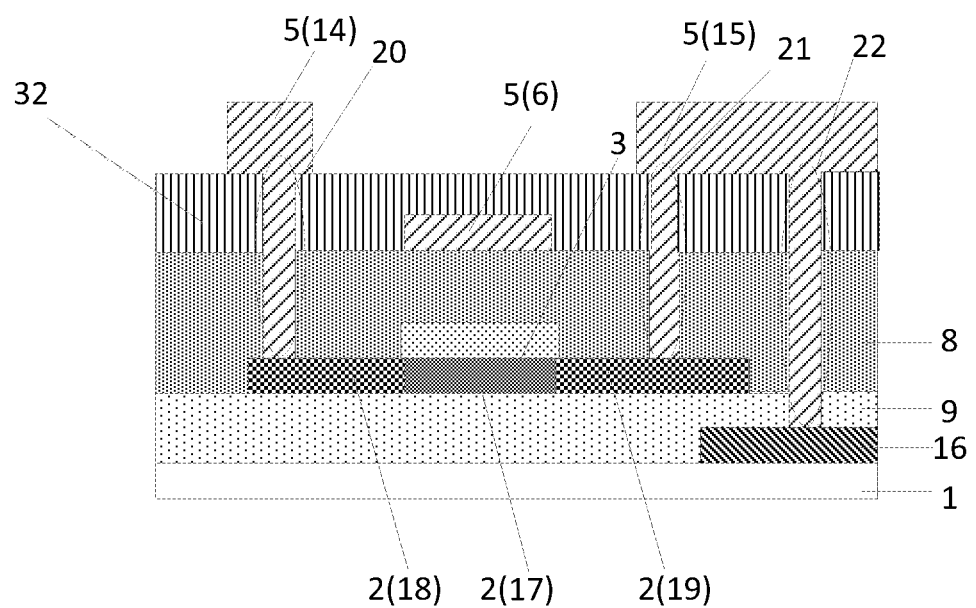
FIG. 7 is a schematic structural diagram of yet another display substrate provided by an embodiment of the present disclosure.

In some embodiments, as shown in FIG. 7, the display substrate further includes: a third insulating layer 32 disposed on the second conductive layer, and a source and drain electrode layer disposed on the third insulating layer 32; and the source and drain electrode layer includes sources 14 and drains 15. In specific implementation, the gates may not be disposed on the same layer as the sources and the drains, and the second conductive layer includes, for example, the first electrode of the capacitor, that is, when the conductive layer including the electrode of the capacitor is additionally disposed, the gate may also be disposed on the same layer as a capacitor electrode other than the first conductive layer.

It should be noted that in specific implementation, the quantity of the conductive layers and a specific pattern of each film layer may be set according to the specific quantity of the transistors and the capacitors in the pixel drive circuit.

Figure 5:
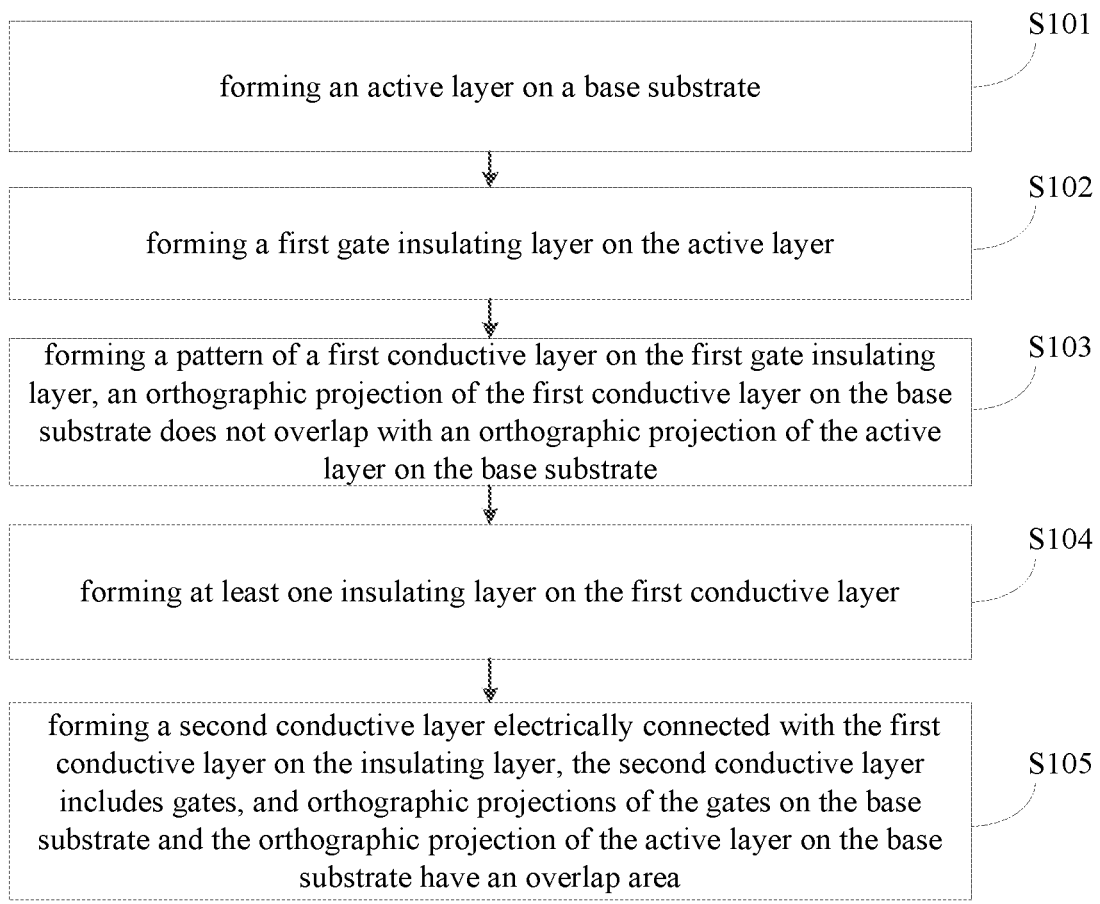
FIG. 5 is a schematic diagram of a preparation method of a display substrate provided by an embodiment of the present disclosure.

Based on the same inventive concept, the embodiments of the present disclosure further provide a preparation method of a display substrate. As shown in FIG. 5, the method includes:

S101, forming an active layer on a base substrate;

S102, forming a first gate insulating layer on the active layer;

S103, forming a pattern of a first conductive layer on the first gate insulating layer, an orthographic projection of the first conductive layer on the base substrate does not overlap with an orthographic projection of the active layer on the base substrate;

S104, forming at least one insulating layer on the first conductive layer; and

S105, forming a second conductive layer electrically connected with the first conductive layer on the insulating layer, the second conductive layer includes gates, and orthographic projections of the gates on the base substrate and the orthographic projection of the active layer on the base substrate have an overlap area.

In some embodiments, the forming the at least one insulating layer on the first conductive layer, includes:

forming a first insulating layer on the first conductive layer; and forming a via hole penetrating through the first insulating layer and exposing the first conductive layer.

The forming the second conductive layer electrically connected with the first conductive layer on the insulating layer, includes:

depositing a conductive material on the first insulating layer to form the second conductive layer, and forming a pattern of the gates by adopting a patterning process; at least one of the gate is electrically connected with the first conductive layer through the via hole.

In some embodiments, the forming the pattern of the first conductive layer, includes:

depositing a conductive material on the first gate insulating layer to form the first conductive layer;

coating photoresist on the first conductive layer;

performing patterning treatment on the photoresist by adopting a halftone mask process, removing all the photoresist in a first region, thinning the photoresist in a second region, and reserving the photoresist in a third region, in the second region, the orthographic projection of the active layer on the base substrate and the orthographic projection of the first conductive layer on the base substrate have an overlap area;

removing the first conductive layer in the first region by adopting a wet etching process;

removing the photoresist in the second region, and thinning the photoresist in the third region;

removing the first conductive layer in the second region by adopting the wet etching process; and stripping off the photoresist in the third region.

In some embodiments, while adopting the patterning process to form the pattern of the gate, the method further includes:

forming patterns of sources and drains.

Figure 6:
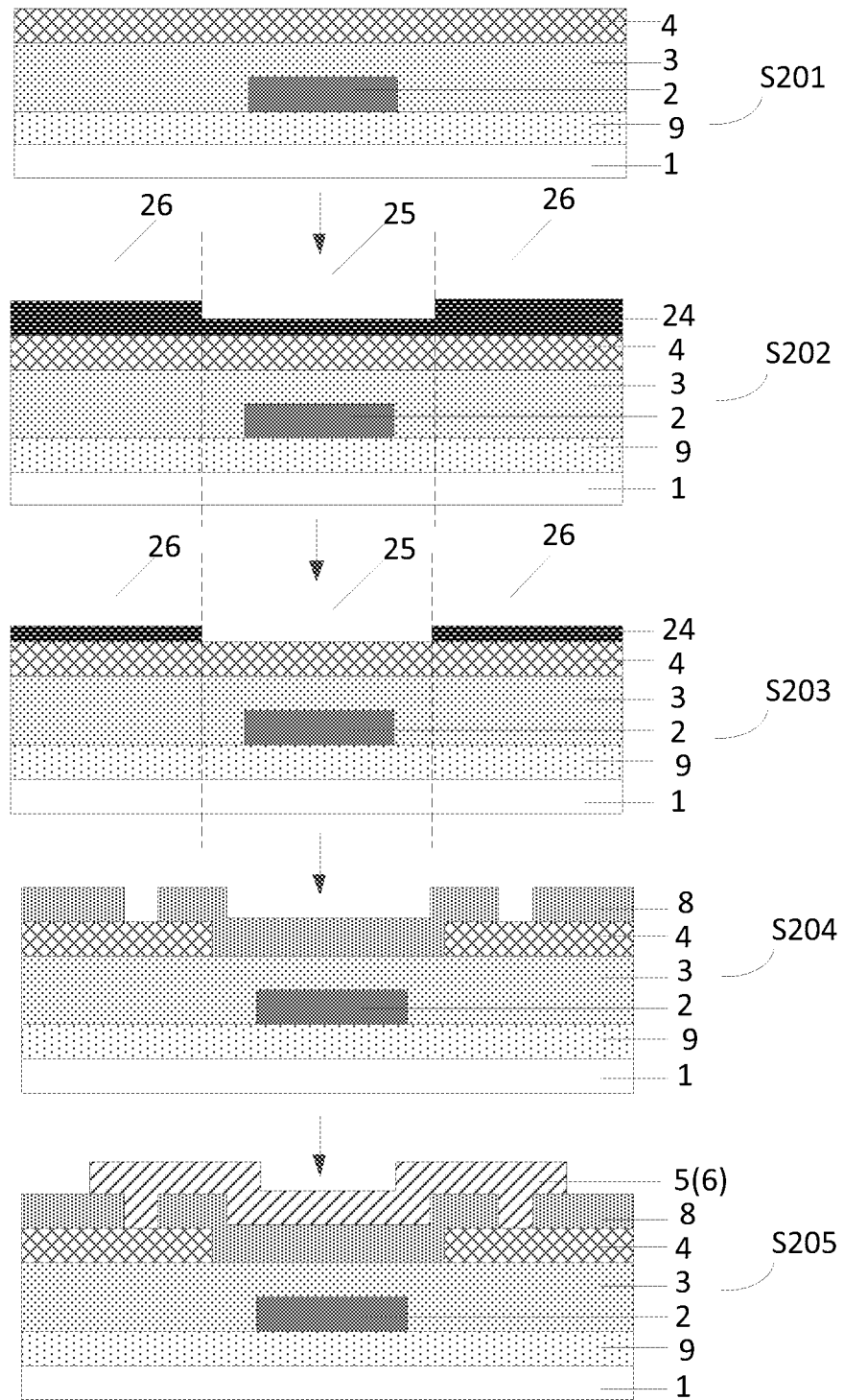
FIG. 6 is a schematic diagram of a preparation method of another display substrate provided by an embodiment of the present disclosure.

Next, taking the gates, the sources and the drains which are disposed on the same layer as an example, the preparation method of the display substrate provided by the embodiments of the present disclosure will be described. As shown in FIG. 6, the preparation of the display substrate includes the following steps:

S201, a light shielding layer, a buffer layer 9, the active layer 2 and the first gate insulating layer 3 are sequentially formed on the base substrate 1, and the conductive material is deposited on the first gate insulating layer 3 to form the first conductive layer 4;

S202, the first conductive layer 4 is coated with photoresist 24, the photoresist 24 is patterned by adopting the halftone mask process, all the photoresist is removed in the first region, the photoresist 24 is thinned in the second region, and the photoresist 24 is reserved in the third region 26;

S203, the first conductive layer in the first region is removed by the wet etching process, then the photoresist 24 in the second region 25 is removed, the photoresist 24 in the third region 26 is thinned, and the first conductive layer 4 in the second region 25 is removed by the wet etching process;

S204, the photoresist in the third region is stripped off, the first insulating layer 8 is formed on the first conductive layer 4, and the via hole is formed in the first insulating layer by adopting the patterning process; and S205, the pattern of the second conductive layer 5 including the gates 6, the sources and the drains is formed on the first insulating layer 8.

In step S205, the preparation method of the display substrate further includes the steps of forming a protective layer, a color film layer, a planarization layer, and each film layer of a light-emitting device.

The embodiments of the present disclosure provide a display apparatus, including the display substrate provided by the embodiments of the present disclosure.

The display apparatus provided by the embodiments of the present disclosure may be any product or component with a display function, such as a mobile phone, a tablet computer, a television, a display, a notebook computer, a digital photo frame, and a navigator. Other essential components of the display apparatus will be apparent to those ordinarily skilled in the art and will not be described in detail herein, nor supposed to limit the present disclosure. The implementation of the display apparatus may refer to the above-mentioned embodiments of the display substrate, and repetitive parts will not be repeated.

In conclusion, according to the display substrate, the preparation method thereof, and the display apparatus provided by the embodiments of the present disclosure, the first gate insulating layer is included between the first conductive layer and the active layer, the orthographic projection of the first conductive layer on the base substrate does not overlap with the orthographic projection of the active layer on the base substrate, and at least one insulating layer is included between the gates of which the orthographic projections overlap with the orthographic projection of the active layer on the base substrate and the first conductive layer, that is, at least two insulating layers are included between the gates and the active layer. Even if the foreign materials such as the particles appear in the preparation process of the display substrate and consequently the first gate insulating layer is pierced or the first gate insulating layer is partially peeled off, the insulating layer disposed on the first gate insulating layer may cover the foreign materials such as the particles, so that the active layer and the gate can be prevented from conducting, the bright point and dark point can be prevented from showing poorly, and the display effect is improved.

It is apparent to those skilled in the art that various modifications and variations can be made in the present disclosure without departing from the spirit or scope of the present disclosure. In this case, if these modifications and variations of the present disclosure fall within the scope of claims and their equivalents, the present disclosure also intends to include these modifications and variations.

What is claimed is:

1. A display substrate, comprising:
   a base substrate;
   an active layer disposed on the base substrate;
   a first gate insulating layer disposed on the active layer;
   a first conductive layer disposed on the first gate insulating layer; and
   a second conductive layer disposed on the first conductive layer and electrically connected with the first conductive layer, wherein
      an orthographic projection, on the base substrate, of the first conductive layer does not overlap with an orthographic projection, on the base substrate, of the active layer;
      the second conductive layer comprises gates, and orthographic projections, on the base substrate, of the gates and the orthographic projection, on the base substrate, of the active layer have an overlap area; and
   the display substrate further comprises:
      at least one insulating layer disposed between the first conductive layer and the gates.

2. The display substrate according to claim 1, wherein the at least one insulating layer comprises a first insulating layer; wherein
   the first conductive layer comprises a first connection lead part and a second connection lead part respectively disposed on two sides of the active layer;
   the first insulating layer is provided with a first via hole exposing the first connection lead part and a second via hole exposing the second connection lead part; and
   at least one of the gates is electrically connected with the first connection lead part through the first via hole, and is electrically connected with the second connection lead part through the second via hole.

3. The display substrate according to claim 2, further comprising:
   a third conductive layer disposed between the first insulating layer and the gates, wherein
   the at least one insulating layer further comprises a second insulating layer disposed between the third conductive layer and the gates.

4. The display substrate according to claim 2, wherein the second conductive layer further comprises sources and drains.

5. The display substrate according to claim 2, further comprising:
   a third insulating layer disposed on the second conductive layer; and
   a source and drain electrode layer disposed on the third insulating layer, wherein the source and drain electrode layer comprises sources and drains.

6. The display substrate according to claim 1, further comprising:
   a light shielding layer disposed between the base substrate and the active layer.

7. The display substrate according to claim 1, further comprising:
   a protective layer disposed on the second conductive layer.

8. A preparation method of the display substrate according to claim 1, comprising:
   forming the active layer on the base substrate;
   forming the first gate insulating layer on the active layer;
   forming a pattern of the first conductive layer on the first gate insulating layer, wherein the orthographic projection, on the base substrate, of the first conductive layer does not overlaps with the orthographic projection, on the base substrate, of the active layer;
   forming the at least one insulating layer on the first conductive layer; and
   forming the second conductive layer electrically connected with the first conductive layer on the at least one insulating layer, wherein the second conductive layer comprises the gates, and the orthographic projections, on the base substrate, of the gates and the orthographic projection, on the base substrate, of the active layer have the overlap area.

9. The method according to claim 8, wherein the forming the at least one insulating layer on the first conductive layer, comprises:
   forming a first insulating layer on the first conductive layer, and
   forming a via hole penetrating through the first insulating layer and exposing the first conductive layer; and
   the forming the second conductive layer electrically connected with the first conductive layer on the at least one insulating layer comprises:
      depositing a conductive material on the first insulating layer to form the second conductive layer, and forming a pattern of the gates by adopting a patterning process, wherein at least one of the gates is electrically connected with the first conductive layer through the via hole.

10. The method according to claim 8, wherein the forming the pattern of the first conductive layer, comprises:
    depositing a conductive material on the first gate insulating layer to form the first conductive layer;
    coating photoresist on the first conductive layer;
    performing patterning treatment on the photoresist by adopting a halftone mask process, removing all the photoresist in a first region, thinning the photoresist in a second region, and reserving the photoresist in a third region, wherein in the second region, the orthographic projection, on the base substrate, of the active layer and the orthographic projection, on the base substrate, of the first conductive layer have an overlap area;
    removing the first conductive layer in the first region by adopting a wet etching process;

removing the photoresist in the second region, and thinning the photoresist in the third region;

removing the first conductive layer in the second region by adopting the wet etching process; and stripping off the photoresist in the third region.

11. The method according to claim 8, wherein while forming the pattern of the gate by adopting the patterning process, the method further comprises:

forming patterns of sources and drains.

12. A display apparatus, comprising a display substrate, wherein the display substrate comprises:

a base substrate;

an active layer disposed on the base substrate;

a first gate insulating layer disposed on the active layer;

a first conductive layer disposed on the first gate insulating layer; and a second conductive layer disposed on the first conductive layer and electrically connected with the first conductive layer;

an orthographic projection, on the base substrate, of the first conductive layer does not overlap with an orthographic projection, on the base substrate, of the active layer;

the second conductive layer comprises: gates, and orthographic projections, on the base substrate, of the gates and the orthographic projection, on the base substrate, of the active layer have an overlap area; and the display substrate further comprises:

at least one insulating layer located between the first conductive layer and the gates.

13. The display apparatus according to claim 12, wherein the at least one insulating layer comprises a first insulating layer disposed;

the first conductive layer comprises a first connection lead part and a second connection lead part respectively disposed on two sides of the active layer;

the first insulating layer is provided with a first via hole exposing the first connection lead part and a second via hole exposing the second connection lead part; and at least one of the gates is electrically connected with the first connection lead part through the first via hole, and is electrically connected with the second connection lead part through the second via hole.

14. The display apparatus according to claim 13, wherein the display substrate further comprises a third conductive layer disposed between the first insulating layer and the gates; and the at least one insulating layer further comprises a second insulating layer disposed between the third conductive layer and the gates.

15. The display apparatus according to claim 13, wherein the display substrate comprises:

a third insulating layer disposed on the second conductive layer; and a source and drain electrode layer disposed on the third insulating layer, wherein the source and drain electrode layer comprises sources and drains.

* * * * *